(12) United States Patent
Takama

(10) Patent No.: US 11,277,950 B2
(45) Date of Patent: Mar. 15, 2022

(54) COMPONENT MOUNTING DEVICE

(71) Applicant: YAMAHA HATSUDOKI KABUSHIKI KAISHA, Iwata (JP)

(72) Inventor: Kazushi Takama, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 8 days.

(21) Appl. No.: 16/652,023

(22) PCT Filed: Sep. 28, 2017

(86) PCT No.: PCT/JP2017/035172
§ 371 (c)(1),
(2) Date: Mar. 27, 2020

(87) PCT Pub. No.: WO2019/064413
PCT Pub. Date: Apr. 4, 2019

(65) Prior Publication Data
US 2020/0253103 A1 Aug. 6, 2020

(51) Int. Cl.
*H05K 13/04* (2006.01)
*H05K 13/08* (2006.01)
*G06T 7/00* (2017.01)
*H05K 3/00* (2006.01)

(52) U.S. Cl.
CPC ....... *H05K 13/0812* (2018.08); *G06T 7/0002* (2013.01); *H05K 3/0008* (2013.01);
(Continued)

(58) Field of Classification Search
CPC ........... H05K 13/0812; H05K 13/0409; H05K 13/0813; H05K 13/0411; H05K 13/0015;
(Continued)

(56) References Cited

U.S. PATENT DOCUMENTS 10,842,060 B2 * 11/2020 Takama ............. H05K 13/0815
2014/0043033 A1 2/2014 Butters et al.
2014/0198185 A1 7/2014 Haugen et al.

FOREIGN PATENT DOCUMENTS

CN 104937367 A 9/2015
JP H08-064999 A 3/1996
(Continued)

OTHER PUBLICATIONS

International Search Report issued in PCT/JP2017/035172; dated Nov. 21, 2017.
(Continued)

*Primary Examiner* — Thiem D Phan
(74) *Attorney, Agent, or Firm* — Studebaker & Brackett PC

(57) ABSTRACT

A component mounting device includes a head unit including a mounting head configured to mount a component on a substrate, and an imaging unit provided on the head unit and configured to image at least one of a suction position of the component to be suctioned by the mounting head and a mounting position of the component mounted by the mounting head from a plurality of directions, such that the imaging unit is configured to capture a first image and a second image. The component mounting device is configured to expand or contract the first image captured by the imaging unit in accordance with an imaging direction of the second image, and acquire a height position of an imaged location based on the first image that has been expanded or contracted and the second image.

20 Claims, 4 Drawing Sheets

(52) U.S. Cl.
CPC ..... *H05K 13/0408* (2013.01); *H05K 13/0452* (2013.01); *G06T 2207/10* (2013.01); *H05K 2203/166* (2013.01); *Y10T 29/5313* (2015.01)

(58) Field of Classification Search
CPC ........... Y10T 29/5313; Y10T 29/53174; Y10T 29/53191; Y10T 29/4913; Y10T 29/49124; Y10T 29/49004; Y10T 29/49764
USPC ......... 29/729, 705, 720, 739, 740, 593, 829, 29/832, 833, 834
See application file for complete search history.

(56) References Cited

FOREIGN PATENT DOCUMENTS

| | | |
|---|---|---|
| JP | 2001-109879 A | 4/2001 |
| JP | 2007-103660 A | 4/2007 |
| JP | 4596422 B2 | 12/2010 |
| JP | 2014-216621 A | 11/2014 |
| WO | 2017/064776 A1 | 4/2017 |
| WO | 2017/064786 A1 | 4/2017 |

OTHER PUBLICATIONS

Written Opinion issued in PCT/JP2017/035172; dated Nov. 21, 2017.

An Office Action mailed by the China National Intellectual Property Administration dated Dec. 18, 2020, which corresponds to Chinese Patent Application No. 201780094739.5 and is related to U.S. Appl. No. 16/652,023.

An Office Action issued by the China National Intellectual Property Administration dated Aug. 26, 2020, which corresponds to Chinese Patent Application No. 201780094739.5 and is related to U.S. Appl. No. 16/652,023 with English language translation.

\* cited by examiner

DURING SUCTION OF COMPONENT

DURING MOUNTING OF COMPONENT

HEIGHT POSITION ACQUISITION PROCESS

COMPONENT MOUNTING DEVICE

CROSS-REFERENCE TO RELATED APPLICATION

This application is a National Stage of International Patent Application No. PCT/JP2017/035172, filed Sep. 28, 2017, the entire content of which is incorporated herein by reference.

BACKGROUND

Technical Field

The present disclosure relates to a component mounting device.

Background Art

In general, a component mounting device is known. A component mounting device is disclosed in Japanese Patent Laying-Open No. 2014-216621, for example.

Japanese Patent Laying-Open No. 2014-216621 discloses a component mounting device including a suction nozzle that mounts a component on a substrate, and a camera module capable of imaging the mounting position of the component mounted by the suction nozzle from a plurality of directions. This component mounting device is configured to measure a three-dimensional position of mounting by performing stereo measurement based on images captured from the plurality of directions.

SUMMARY

However, in the component mounting device disclosed in Japanese Patent Laying-Open No. 2014-216621, when stereo measurement is performed based on the images captured from the plurality of directions, images captured from different directions are conceivably compared (matched) and analyzed. In this case, the dimensions of targets to be imaged in the images differ between the images captured from the plurality of directions, and thus it is disadvantageously difficult to accurately compare (match) a plurality of images. Consequently, there is a problem that it is difficult to accurately measure the three-dimensional position (height position) of mounting.

Accordingly, the present disclosure provides a component mounting device capable of accurately acquiring the height position of a location imaged by an imager.

A component mounting device according to an aspect of the present disclosure includes a head unit including a mounting head configured to mount a component on a substrate, and an imager provided on the head unit and configured to be able to image at least one of a suction position of the component to be suctioned by the mounting head and a mounting position of the component mounted by the mounting head from a plurality of directions, such that the imager is configured to capture a first image and a second image. The first image captured by the imager is expanded or contracted in accordance with an imaging direction of the second image, and a height position of an imaged location is acquired based on the first image that has been expanded or contracted and the second image.

In the component mounting device according to this aspect of the present disclosure, as described above, the first image captured by the imager is expanded or contracted in accordance with the imaging direction of the second image, and the height position of the imaged location is acquired based on the expanded or contracted first image and the second image. Accordingly, the dimensions of targets to be imaged in the images can be uniform between the first image and the second image captured from the plurality of directions, and thus comparison (matching) between the expanded or contracted first image and the second image can be accurately performed. That is, the degree of match between the first image and the second image can be increased. Thus, the height position of the location imaged by the imager can be accurately acquired.

In the component mounting device according to this aspect, the first image is preferably expanded or contracted such that a horizontal length of the first image matches a horizontal length of the second image. Accordingly, the first image is expanded or contracted at the mounting position on the substrate that extends in a horizontal direction or the suction position of the component such that the lengths (dimension) in the horizontal direction, in which there are more characteristic points than in an upward-downward direction, are matched, and thus the expanded or contracted first image and the second image can be easily compared.

In the aforementioned component mounting device according to this aspect, the imager is preferably configured to be able to perform imaging from a plurality of oblique directions with respect to a vertical direction. Accordingly, in a state in which the mounting head is disposed above the suction position or the mounting position of the component, the imager can image the suction position or the mounting position of the component, and thus the component suction operation or the component mounting operation performed by the mounting head can be easily performed concurrently with the imaging operation. Thus, an increase in the time required for the component suction operation or the component mounting operation can be significantly reduced or prevented.

In this case, the imager is preferably configured to capture the first image from an oblique direction having a first angle with respect to a horizontal direction, and to capture the second image from an oblique direction having a second angle larger than the first angle with respect to the horizontal direction. The first image is preferably stretched in accordance with the imaging direction of the second image, and the height position of the imaged location is preferably acquired based on the first image that has been stretched and the second image. Accordingly, the first image having a shorter horizontal length can be stretched in accordance with the second image having a longer horizontal length, and thus the degree of match between the images can be increased. In addition, the first image can also be stretched in an upward-downward direction along with the stretch in the horizontal direction, and thus the resolution in the upward-downward direction can be improved.

In the aforementioned component mounting device according to this aspect, a portion of the first image that has been expanded or contracted is preferably matched with the second image using the portion of the first image as a template such that the height position of the imaged location is acquired. Accordingly, the first image and the second image can be easily compared by template matching, and thus the height position of the location imaged by the imager can be easily acquired.

In the aforementioned component mounting device according to this aspect, the imager preferably includes a plurality of cameras, or a single camera and an optical system configured to divide a field of view of the single camera. Accordingly, the imaged location can be easily imaged from the plurality of directions by the plurality of cameras, or the optical system configured to divide the field of view of the single camera.

In the aforementioned component mounting device according to this aspect, the imager is preferably configured to capture the first image from an oblique direction having an angle θ1 with respect to a horizontal direction, and to capture the second image from an oblique direction having an angle θ2 with respect to the horizontal direction. The first image is preferably expanded or contracted in accordance with the imaging direction of the second image by multiplication by sin(θ2)/sin(θ1). Accordingly, the horizontal length (dimension) of the first image can easily match the horizontal length (dimension) of the second image.

According to the present disclosure, as described above, it is possible to provide the component mounting device capable of accurately acquiring the height position of the location imaged by the imager.

DETAILED DESCRIPTION

An embodiment embodying the present disclosure is hereinafter described on the basis of the drawings.

(Structure of Component Mounting Device)

The structure of a component mounting device 100 according to the embodiment of the present disclosure is now described with reference to FIG. 1.

Figure 1:
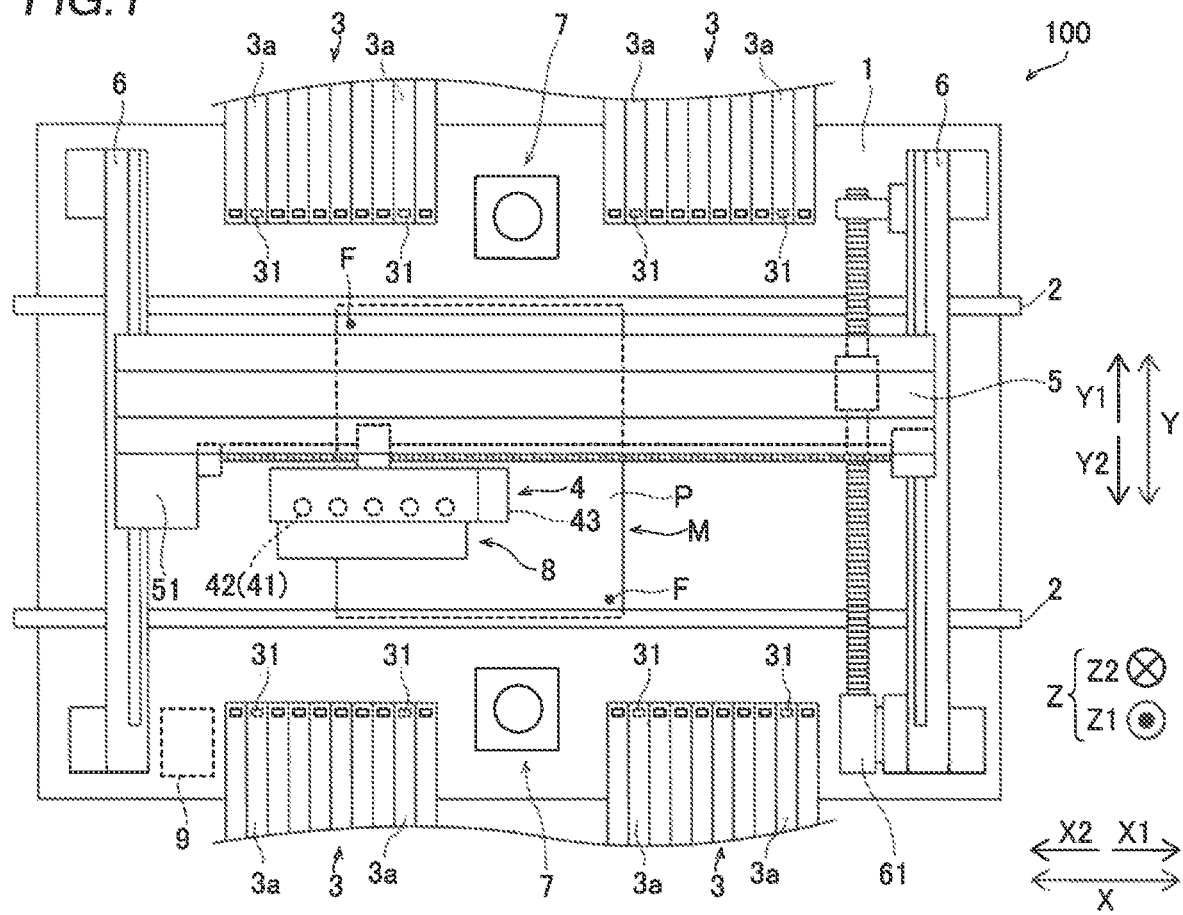
FIG. 1 is diagram showing the overall structure of a component mounting device according to an embodiment of the present disclosure.

As shown in FIG. 1, the component mounting device 100 is a component mounting device configured to convey a substrate P in an X direction by a pair of conveyors 2 and to mount components 31 on the substrate P at a mounting operation position M.

The component mounting device 100 includes a base 1, the pair of conveyors 2, component feeders 3, a head unit 4, a support 5, a pair of rails 6, component recognition imagers 7, an imaging unit 8, and a controller 9. The imaging unit 8 is an example of an "imager" in the claims.

The pair of conveyors 2 are installed on the base 1 and are configured to convey the substrate P in the X direction. In addition, the pair of conveyors 2 include a holding mechanism that holds the substrate P being conveyed in a stopped state at the mounting operation position M. Moreover, an interval between the pair of conveyors 2 in a Y direction can be adjusted according to the dimensions of the substrate P.

The component feeders 3 are disposed outside (Y1 and Y2 sides) of the pair of conveyors 2. A plurality of tape feeders 3a are disposed in the component feeders 3. The component feeders 3 are configured to feed the components 31 to mounting heads 42 described below.

The tape feeders 3a hold reels (not shown) on which tapes that hold a plurality of components 31 at a predetermined interval are wound. The tape feeders 3a are configured to feed the components 31 from the tips of the tape feeders 3a by rotating the reels to feed the tapes that hold the components 31. The components 31 include electronic components such as ICs, transistors, capacitors, and resistors.

The head unit 4 is disposed above the pair of conveyors 2 and the component feeders 3, and includes a plurality of (five) mounting heads 42 including nozzles 41 (see FIG. 2) attached to their lower ends and a substrate recognition camera 43.

The mounting heads 42 are configured to mount the components 31 on the substrate P. Specifically, the mounting heads 42 are configured to suction the components 31 supplied by the component feeders 3 and to mount the suctioned components 31 on the substrate P disposed at the mounting operation position M. The mounting heads 42 are movable up and down (movable in a Z direction), and are configured to suction and hold the components 31 fed from the tape feeders 3a by a negative pressure generated at the tips of the nozzles 41 by a negative pressure generator (not shown) and to mount the components 31 at mounting positions on the substrate P.

The substrate recognition camera 43 is configured to image fiducial marks F of the substrate P in order to recognize the position and the orientation of the substrate P. The positions of the fiducial marks F are imaged and recognized such that the mounting positions of the components 31 on the substrate P can be accurately acquired.

The support 5 includes a motor 51. The support 5 is configured to move the head unit 4 in the X direction along the support 5 by driving the motor 51. Opposite ends of the support 5 are supported by the pair of rails 6.

The pair of rails 6 are fixed on the base 1. A rail 6 on the X1 side includes a motor 61. The rails 6 are configured to move the support 5 in the Y direction orthogonal to the X direction along the pair of rails 6 by driving the motor 61. The head unit 4 is movable in the X direction along the support 5, and the support 5 is movable in the Y direction along the rails 6 such that the head unit 4 is movable in a horizontal direction (XY direction).

The component recognition imagers 7 are fixed on the upper surface of the base 1. The component recognition imagers 7 are disposed outside (Y1 and Y2 sides) of the pair of conveyors 2. The component recognition imagers 7 are configured to image the components 31 suctioned by the nozzles 41 of the mounting heads 42 from below (Z2 side) in order to recognize the suction states (suction orientations) of the components 31 prior to mounting of the components 31. Thus, the suction states of the components 31 suctioned by the nozzles 41 of the mounting heads 42 can be acquired by the controller 9.

Figure 2:
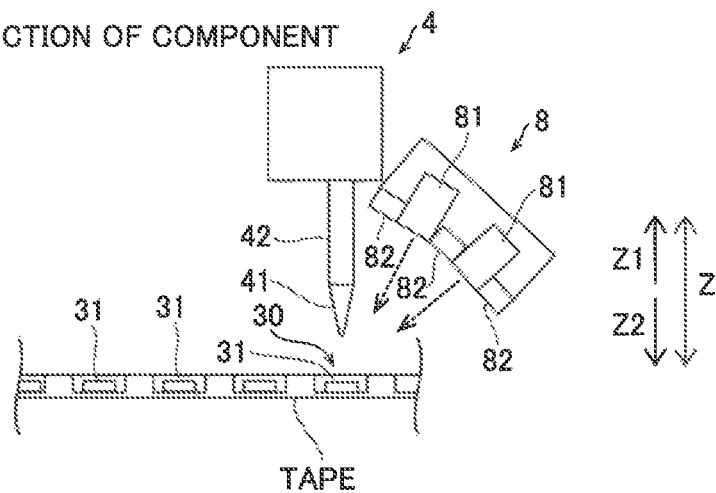
FIG. 2 is a side view of a head unit of the component mounting device according to the embodiment of the present disclosure during suction of a component.
Figure 3:
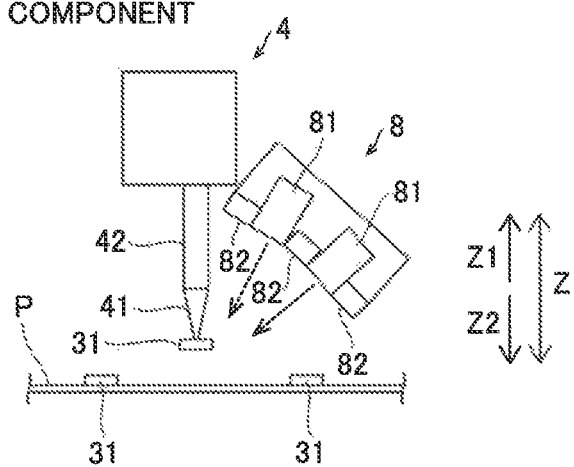
FIG. 3 is a side view of the head unit of the component mounting device according to the embodiment of the present disclosure during mounting of the component.

The imaging unit 8 is provided on the head unit 4. Thus, the imaging unit 8 is configured to move in the horizontal direction (XY direction) together with the head unit 4 as the head unit 4 moves in the XY direction. Furthermore, the imaging unit 8 is configured to be able to image the component feeding location 30 of each of the component feeders 3 from a plurality of directions, as shown in FIG. 2. In addition, the imaging unit 8 is configured to be able to image a mounting position on the substrate P from the plurality of directions, as shown in FIG. 3. As shown in FIGS. 2 and 3, the imaging unit 8 includes a plurality of cameras 81 and illuminators 82. The plurality of cameras 81 have an angle of nip and are longitudinally arranged. Accordingly, the imaging unit 8 can image each of the suction position of a component 31 to be suctioned by each of the mounting heads 42 and the mounting position of the component 31 mounted by each of the mounting heads 42 from the plurality of directions (angles). The imaging unit 8 is offset with respect to the mounting heads 42 so as not to interfere with movement of the mounting heads 42 in an upward-downward direction. Furthermore, the imaging unit 8 is configured to be able to image a position to which each of the mounting heads 42 lowers without moving the head unit 4.

Figure 4:
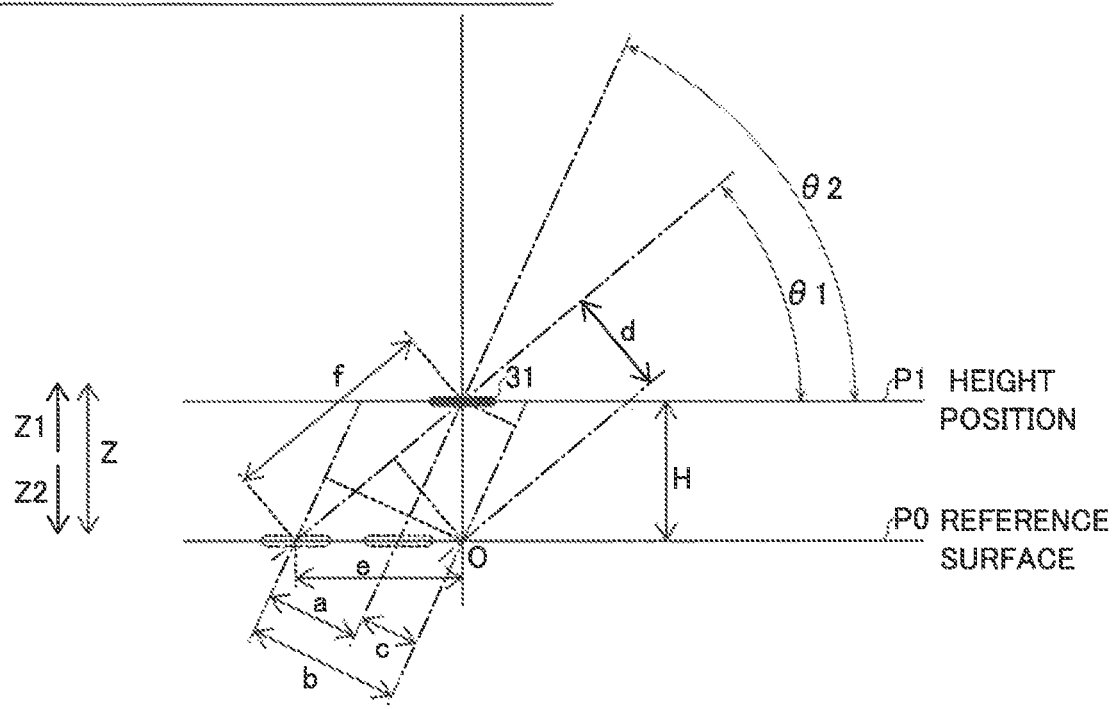
FIG. 4 is a diagram for illustrating acquisition of the height position of an imaged location in the component mounting device according to the embodiment of the present disclosure.

As shown in FIG. 2, the imaging unit 8 is configured to be able to image the component feeding location 30 from a plurality of oblique directions with respect to a vertical direction (Z direction). Furthermore, as shown in FIG. 3, the imaging unit 8 is configured to be able to image the mounting position of the component 31 from the plurality of oblique directions with respect to the vertical direction (Z direction). Specifically, as shown in FIG. 4, the imaging unit 8 is configured to perform imaging from inclination angles (θ1 and θ2) at which imaging directions are different from each other with respect to a reference surface P0. Furthermore, the cameras 81 of the imaging unit 8 are disposed adjacent to each other in a vertical plane (in a YZ plane) including the suction position of the component 31 or the mounting position of the component 31 with respect to the reference surface P0. In addition, the plurality of cameras 81 are vertically offset.

The imaging unit 8 is configured to image the suction position of the component 31 from the plurality of directions to capture a first image and a second image. Furthermore, the imaging unit 8 is configured to capture the first image and the second image by imaging the mounting position of the component 31 from the plurality of directions. That is, the imaging unit 8 is configured to be able to perform imaging from the plurality of oblique directions with respect to the vertical direction (Z direction).

As shown in FIG. 4, the imaging unit 8 is configured to capture the first image from an oblique direction having an angle θ1 with respect to the horizontal direction, and capture the second image from an oblique direction having an angle θ2 larger than the angle θ1 with respect to the horizontal direction. The angle θ1 is an example of a "first angle" in the claims, and the angle θ2 is an example of a "second angle" in the claims.

The illuminators 82 are configured to emit light when the cameras 81 capture images. The illuminators 82 are provided around the cameras 81. The illuminators 82 each include a light source such as an LED (light-emitting diode).

The controller 9 includes a CPU, and is configured to control the overall operation of the component mounting device 100 such as the substrate P conveying operation performed by the pair of conveyors 2, the mounting operation performed by the head unit 4, and the imaging operations performed by the component recognition imagers 7, the imaging unit 8, and the substrate recognition camera 43.

According to this embodiment, the controller 9 is configured to acquire the horizontal (XY direction) position and the vertical (Z direction) height position of the component 31 at the suction position of the component 31 based on the images of the suction position of the component 31 captured from the plurality of directions by the imaging unit 8. Furthermore, the controller 9 is configured to acquire the horizontal (XY direction) position and the vertical (Z direction) height position of mounting of the component 31 based on the images of the mounting position of the component 31 captured from the plurality of directions by the imaging unit 8.

Specifically, as shown in FIG. 4, the controller 9 is configured to acquire a height position P1 with respect to the reference surface P0 through stereo matching. That is, the height position and the horizontal position of an imaged location are acquired by matching the images of the suction position or the mounting position of the component 31 substantially simultaneously captured by the plurality of cameras 81. As the matching, a general matching method such as a sum of squared difference (SSD) or a sum of absolute difference (SAD) is used.

According to this embodiment, the controller 9 is configured to expand or contract the first image captured by the imaging unit 8 in accordance with the imaging direction of the second image, and acquire the height position of the imaged location based on the expanded or contracted first image and the second image. Specifically, the controller 9 is configured to expand or contract the first image such that the horizontal length of the first image matches the horizontal length of the second image.

The controller 9 is configured to stretch the first image in accordance with the imaging direction of the second image, and acquire the height position of the imaged location based on the stretched first image and the second image. The controller 9 is configured to acquire the height position of the imaged location by matching a portion of the expanded or contracted first image as a template with the second image. Furthermore, the controller 9 is configured to expand or contract the first image in accordance with the imaging direction of the second image by multiplication by sin(θ2)/sin(θ1).

Specifically, as shown in FIG. 4, a target to be imaged is imaged at the inclination angle θ1 by one camera 81, and is imaged at the inclination angle θ2 by the other camera 81. That is, the target to be imaged is substantially simultaneously imaged by the plurality of cameras 81. Then, stereo matching between the first image at the inclination angle θ1 and the second image at the inclination angle θ2 is performed such that a parallax a (pixel) between the two captured images is obtained. Here, a value obtained by expanding or contracting an offset value (a deviation value of the reference surface P0 from a reference position O) of the first image captured at the angle θ1 in accordance with the angle θ2 is defined as a distance b (pixel). An offset value (a deviation value of the reference surface P0 from the reference position O) of the second image captured at the angle θ2 is defined as a distance c (pixel). Using the distances b and c, the parallax a is obtained from a formula (1).

$$a = b - c \tag{1}$$

When the offset value of the first image captured at the angle θ1 is defined as a distance d (pixel) and the offset value on the reference surface P0 is defined as a distance e (pixel), the relationship of a formula (2) is derived.

$$d = e \times \sin(\theta 1) \tag{2}$$

When the distance b and the distance e are used, the relationship of a formula (3) is derived.

$$b = e \times \sin(\theta 2) \tag{3}$$

A formula (4) is derived from the formula (2) and the formula (3).

$$b = d \times \sin(\theta 2)/\sin(\theta 1) \quad (4)$$

That is, the distance d (pixel) of the offset value of the first image captured by the angle θ1 is multiplied by sin(θ2)/sin(θ1) such that the distance d is converted into the distance b that matches the second image at the angle θ2.

A formula (5) is derived from the formulas (1) and (4).

$$a = d \times \sin(\theta 2)/\sin(\theta 1) - c \quad (5)$$

A distance f (pixel) is obtained from a formula (6) using the parallax a.

$$f = a/\sin(\theta 2 - \theta 1) \quad (6)$$

A height value H (pixel) is obtained from a formula (7) using the distance f.

$$H = f \times \sin(\theta 1) \quad (7)$$

A formula (8) is derived from the formulas (6) and (7).

$$H = a \times \sin(\theta 1)/\sin(\theta 2 - \theta 1) \quad (8)$$

When the camera resolution of the cameras 81 is defined as R (μm/pixel), a height H1 (μm) with respect to the reference surface P0 is obtained from a formula (9).

$$H1 = H \times R \quad (9)$$

Thus, the vertical height position and the horizontal position at the suction position or the mounting position of the component 31 are accurately obtained. Note that angular errors occur due to deviation from the centers of the fields of view of the cameras 81 depending on the height position and the position of the target to be imaged. The angular error is corrected by a table obtained in advance or calculation, for example.

Figure 5:
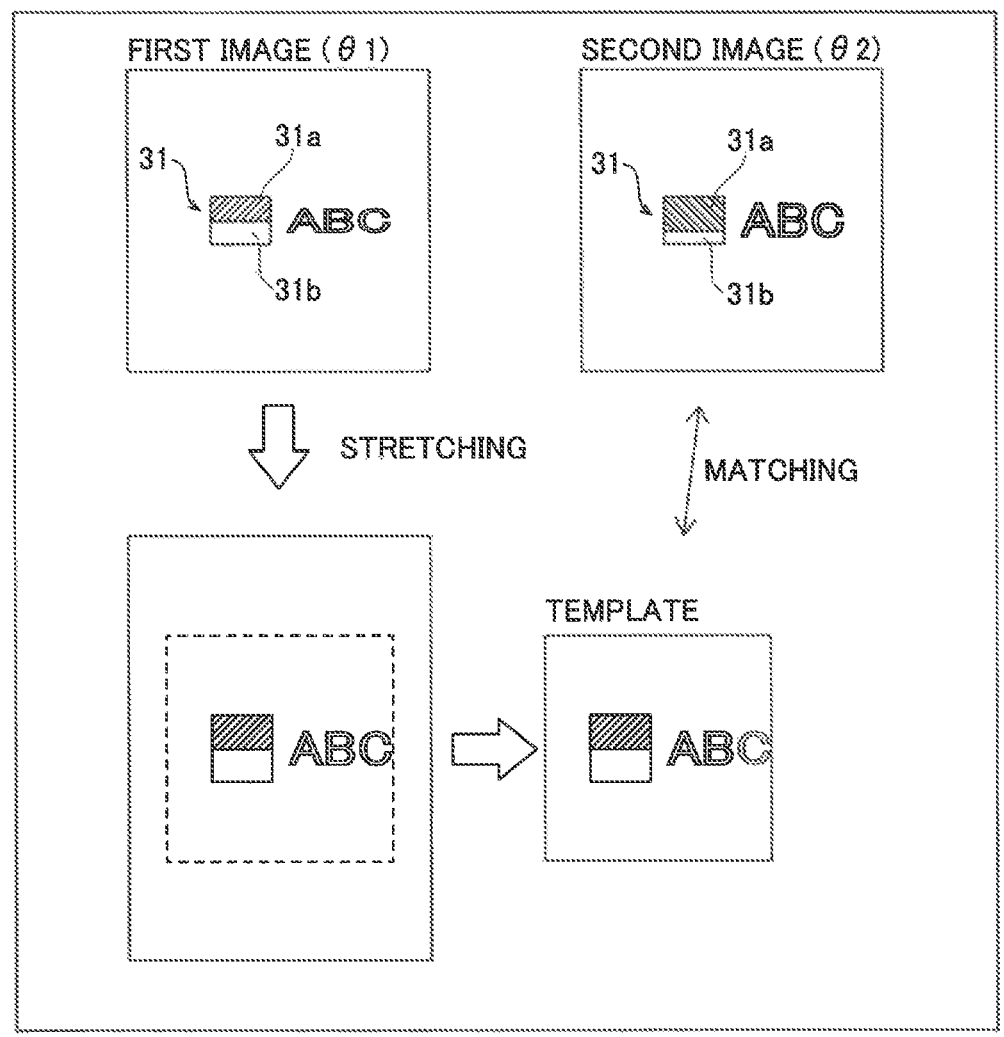
FIG. 5 is a diagram showing an example of matching between a first image and a second image in the component mounting device according to the embodiment of the present disclosure.

As shown in FIG. 5, the first image captured from the angle θ1 is stretched in accordance with the second image. Specifically, the first image is stretched by multiplying the longitudinal direction of the first image by sin(θ2)/sin(θ1). Then, a portion of the stretched first image is extracted such that a template is acquired. For example, as the template, a rectangular image of predetermined pixels is extracted from the center of the stretched first image.

The degree of match is compared while the template extracted from the first image is shifted by one pixel at a time on the second image. Then, a point having the highest degree of match is obtained as a matching point. The parallax is obtained from the obtained matching point, and the three-dimensional position of the imaged location is obtained.

According to this embodiment, the following advantageous effects are achieved.

According to this embodiment, as described above, the first image captured by the imaging unit 8 is expanded or contracted in accordance with the imaging direction of the second image, and the height position of the imaged location is acquired based on the expanded or contracted first image and the second image. Accordingly, the dimensions of the targets to be imaged in the images can be uniform between the first image and the second image captured from the plurality of directions, and thus comparison (matching) between the expanded or contracted first image and the second image can be accurately performed. That is, the degree of match between the first image and the second image can be increased. Thus, the height position of the location imaged by the imager can be accurately acquired.

According to this embodiment, as described above, the first image is expanded or contracted such that the horizontal length of the first image matches the horizontal length of the second image. Accordingly, the first image is expanded or contracted at the mounting position on the substrate P that extends in the horizontal direction or the suction position of the component such that the lengths (dimension) in the horizontal direction, in which there are more characteristic points than in an upward-downward direction, are matched, and thus the expanded or contracted first image and the second image can be easily compared.

According to this embodiment, as described above, the imaging unit 8 is configured to be able to perform imaging from the plurality of oblique directions with respect to the vertical direction (Z direction). Accordingly, in a state in which the mounting head 42 is disposed above the suction position or the mounting position of the component 31, the imaging unit 8 can image the suction position or the mounting position of the component 31, and thus the component suction operation or the component mounting operation performed by the mounting head 42 can be easily performed concurrently with the imaging operation. Thus, an increase in the time required for the component suction operation or the component mounting operation can be significantly reduced or prevented.

According to this embodiment, as described above, the imaging unit 8 is configured to capture the first image from the oblique direction having an angle θ1 with respect to the horizontal direction, and to capture the second image from the oblique direction having an angle θ2 larger than the angle θ1 with respect to the horizontal direction. Furthermore, the first image is stretched in accordance with the imaging direction of the second image, and the height position of the imaged location is acquired based on the stretched first image and the second image. Accordingly, the first image having a shorter horizontal length can be stretched in accordance with the second image having a longer horizontal length, and thus the degree of match between the images can be increased. In addition, the first image can also be stretched in the upward-downward direction along with the stretch in the horizontal direction, and thus the resolution in the upward-downward direction can be improved.

Specifically, when the first image is not stretched, the resolution of the cameras is defined as R (μm/pixel) such that the height resolution Rh1 (pixel/μm) is expressed by a formula (10).

$$Rh1 = (\cos(\theta 1) - \cos(\theta 2))/R \quad (10)$$

When the first image is stretched, the height resolution Rh2 (pixel/μm) is expressed by a formula (11).

$$Rh2 = (\cos(\theta 1) \times \sin(\theta 2)/\sin(\theta 1) - \cos(\theta 2))/R \quad (11)$$

Here, $Rh2 - Rh1 = \cos(\theta 1) \times (\sin(\theta 2)/\sin(\theta 1) - 1)/R$. Because of 0 degrees<θ1<θ2<90 degrees, sin(θ2)>sin(θ1). Therefore, sin(θ2)/sin(θ1)>1. Thus, Rh2−Rh1>0 and Rh2>Rh1. As described above, the height resolution can be improved by stretching the first image in accordance with the second image.

According to this embodiment, as described above, a portion of the expanded or contracted first image is matched with the second image using the portion of the expanded or contracted first image as a template such that the height position of the imaged location is acquired. Accordingly, the first image and the second image can be easily compared by template matching, and thus the height position of the location imaged by the imaging unit 8 can be easily acquired.

According to this embodiment, as described above, the imaging unit 8 includes the plurality of cameras 81. Accordingly, the imaged location can be easily imaged from the plurality of directions by the plurality of cameras 81.

According to this embodiment, as described above, the imaging unit 8 is configured to capture the first image from the oblique direction having an angle θ1 with respect to the horizontal direction, and to capture the second image from the oblique direction having an angle θ2 with respect to the horizontal direction. Furthermore, the first image is expanded or contracted in accordance with the imaging direction of the second image by multiplication by $\sin(\theta 2)/\sin(\theta 1)$. Accordingly, the horizontal length (dimension) of the first image can easily match the horizontal length (dimension) of the second image.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

Figure 6:
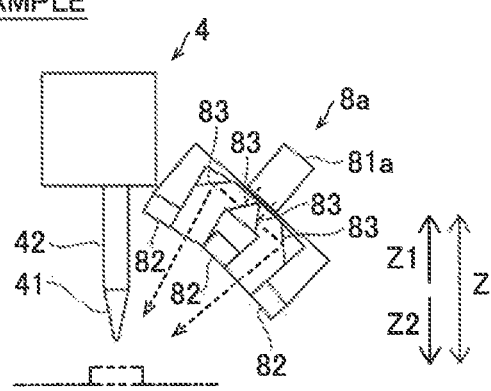
FIG. 6 is a side view of a head unit of a component mounting device according to a modified example of the embodiment of the present disclosure.

For example, while the example in which the imaging unit includes the plurality of cameras, and the imaged location can be imaged from the plurality of directions has been shown in the aforementioned embodiment, the present disclosure is not restricted to this. In the present disclosure, as in a modified example shown in FIG. 6, an imaging unit 8a may include a camera 81a, illuminators 82, and optical systems 83. In this case, the field of view of the single camera 81a may be divided by the optical systems 83 including lenses and mirrors, and an imaged location may be imaged from a plurality of directions. The imaging unit 8a is an example of an "imager" in the claims.

Alternatively, imaging may be performed while one camera is moved such that the imaged location is imaged from a plurality of directions.

While the example in which the controller performs a process of expanding or contracting the first image in accordance with the imaging direction of the second image has been shown in the aforementioned embodiment, the present disclosure is not restricted to this. In the present disclosure, the process of expanding or contracting the first image in accordance with the imaging direction of the second image may be performed by an image processor provided separately from the controller. In this case, the image processor may perform the process with a hardware configuration, or may perform the process with software.

While the example in which the controller acquires the height position of the imaged location based on the expanded or contracted first image and the second image has been shown in the aforementioned embodiment, the present disclosure is not restricted to this. In the present disclosure, the height position of the imaged location may be acquired by a processor provided separately from the controller based on the expanded or contracted first image and the second image. In this case, the processor may perform a process with a hardware configuration, or may perform the process with software.

While the example in which the imager can image both the suction position of the component and the mounting position of the component has been shown in the aforementioned embodiment, the present disclosure is not restricted to this. In the present disclosure, the imager only needs to be able to image at least one of the suction position of the component and the mounting position of the component.

While the example in which the first image is stretched in accordance with the imaging direction of the second image has been shown in the aforementioned embodiment, the present disclosure is not restricted to this. In the present disclosure, the first image may be contracted in accordance with the imaging direction of the second image.

While the example in which the angle with respect to the horizontal plane at which the first image is captured is smaller than the angle with respect to the horizontal plane at which the second image is captured has been shown in the aforementioned embodiment, the present disclosure is not restricted to this. In the present disclosure, the angle with respect to the horizontal plane at which the first image is captured may be larger than the angle with respect to the horizontal plane at which the second image is captured.

While the example in which the first image is expanded or contracted such that the horizontal length of the first image matches the horizontal length of the second image has been shown in the aforementioned embodiment, the present disclosure is not restricted to this. In the present disclosure, the first image may be expanded or contracted such that the length of the first image in a first direction other than the horizontal direction matches the length of the second image in a second direction other than the horizontal direction.

While the example in which the components held on the tape are supplied to the component feeding locations has been shown in the aforementioned embodiment, the present disclosure is not restricted to this. In the present disclosure, the components placed on a tray or the like may be supplied to the component feeding locations.

What is claimed is:

1. A component mounting device comprising:
    a head unit including a mounting head configured to mount a component on a substrate;
    an imager provided on the head unit and configured to image at least one of a suction position of the component to be suctioned by the mounting head and a mounting position of the component mounted by the mounting head from a plurality of directions, such that the imager is configured to capture a first image and a second image; and
    a controller configured to acquire a height position of an imaged location based on an expanded or contracted image that has expanded or contracted the first image captured by the imager in accordance with an imaging direction of the second image and the second image.

2. The component mounting device according to claim 1, wherein
    the controller is configured to expand or contract the first image such that a horizontal length of the first image matches a horizontal length of the second image.

3. The component mounting device according to claim 2, wherein
    the imager is configured to perform imaging from a plurality of oblique directions with respect to a vertical direction.

4. The component mounting device according to claim 3, wherein
    the imager is configured to capture the first image from an oblique direction having a first angle with respect to a horizontal direction, and to capture the second image from an oblique direction having a second angle larger than the first angle with respect to the horizontal direction; and
    the controller is configured to stretch the first image in accordance with the imaging direction of the second image, and acquire the height position of the imaged location based on the first image that has been stretched and the second image.

5. The component mounting device according to claim 2, wherein
the controller is configured to match a portion of the first image that has been expanded or contracted with the second image using the portion of the first image as a template to acquire the height position of the imaged location.

6. The component mounting device according to claim 2, wherein
the imager includes a plurality of cameras, or a single camera and an optical system configured to divide a field of view of the single camera.

7. The component mounting device according to claim 2, wherein
the imager is configured to capture the first image from an oblique direction having an angle $\theta1$ with respect to a horizontal direction, and to capture the second image from an oblique direction having an angle $\theta2$ with respect to the horizontal direction; and
the controller is configured to expand or contract the first image in accordance with the imaging direction of the second image by multiplication by $\sin(\theta2)/\sin(\theta1)$.

8. The component mounting device according to claim 1, wherein
the imager is configured to perform imaging from a plurality of oblique directions with respect to a vertical direction.

9. The component mounting device according to claim 8, wherein
the imager is configured to capture the first image from an oblique direction having a first angle with respect to a horizontal direction, and to capture the second image from an oblique direction having a second angle larger than the first angle with respect to the horizontal direction; and
the controller is configured to stretch the first image in accordance with the imaging direction of the second image, and acquire the height position of the imaged location based on the first image that has been stretched and the second image.

10. The component mounting device according to claim 9, wherein
the controller is configured to match a portion of the first image that has been expanded or contracted with the second image using the portion of the first image as a template to acquire the height position of the imaged location.

11. The component mounting device according to claim 9, wherein
the imager includes a plurality of cameras, or a single camera and an optical system configured to divide a field of view of the single camera.

12. The component mounting device according to claim 9, wherein
the imager is configured to capture the first image from an oblique direction having an angle $\theta1$ with respect to a horizontal direction, and to capture the second image from an oblique direction having an angle $\theta2$ with respect to the horizontal direction; and the controller is configured to expand or contract the first image in accordance with the imaging direction of the second image by multiplication by $\sin(\theta2)/\sin(\theta1)$.

13. The component mounting device according to claim 8, wherein
the controller is configured to match a portion of the first image that has been expanded or contracted with the second image using the portion of the first image as a template to acquire the height position of the imaged location.

14. The component mounting device according to claim 8, wherein
the imager includes a plurality of cameras, or a single camera and an optical system configured to divide a field of view of the single camera.

15. The component mounting device according to claim 8, wherein
the imager is configured to capture the first image from an oblique direction having an angle $\theta1$ with respect to a horizontal direction, and to capture the second image from an oblique direction having an angle $\theta2$ with respect to the horizontal direction; and
the controller is configured to expand or contract the first image in accordance with the imaging direction of the second image by multiplication by $\sin(\theta2)/\sin(\theta1)$.

16. The component mounting device according to claim 1, wherein
the controller is configured to match a portion of the first image that has been expanded or contracted with the second image using the portion of the first image as a template to acquire the height position of the imaged location.

17. The component mounting device according to claim 16, wherein
the imager includes a plurality of cameras, or a single camera and an optical system configured to divide a field of view of the single camera.

18. The component mounting device according to claim 16, wherein
the imager is configured to capture the first image from an oblique direction having an angle $\theta1$ with respect to a horizontal direction, and to capture the second image from an oblique direction having an angle $\theta2$ with respect to the horizontal direction; and
the controller is configured to expand or contract the first image in accordance with the imaging direction of the second image by multiplication by $\sin(\theta2)/\sin(\theta1)$.

19. The component mounting device according to claim 1, wherein
the imager includes a plurality of cameras, or a single camera and an optical system configured to divide a field of view of the single camera.

20. The component mounting device according to claim 1, wherein
the imager is configured to capture the first image from an oblique direction having an angle $\theta1$ with respect to a horizontal direction, and to capture the second image from an oblique direction having an angle $\theta2$ with respect to the horizontal direction; and
the controller is configured to expand or contract the first image in accordance with the imaging direction of the second image by multiplication by $\sin(\theta2)/\sin(\theta1)$.

* * * * *